US009983276B2

(12) United States Patent
Stokely

(10) Patent No.: US 9,983,276 B2
(45) Date of Patent: May 29, 2018

(54) DOWNHOLE ALL-OPTICAL MAGNETOMETER SENSOR

(75) Inventor: Christopher L. Stokely, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 1535 days.

(21) Appl. No.: 13/532,538

(22) Filed: Jun. 25, 2012

(65) Prior Publication Data

US 2013/0342210 A1 Dec. 26, 2013

(51) Int. Cl.
| | | |
|---|---|---|
| *G01V 3/08* | (2006.01) | |
| *G01R 33/26* | (2006.01) | |
| *E21B 47/022* | (2012.01) | |
| *E21B 7/02* | (2006.01) | |
| *G01V 3/32* | (2006.01) | |
| *G01V 8/02* | (2006.01) | |

(52) U.S. Cl.
CPC ............. *G01R 33/26* (2013.01); *E21B 7/024* (2013.01); *E21B 47/022* (2013.01); *G01V 3/32* (2013.01); *G01V 8/02* (2013.01)

(58) Field of Classification Search
CPC ................................ G01R 33/032; G01V 3/08
See application file for complete search history.

(56) References Cited

U.S. PATENT DOCUMENTS

| | | | | |
|---|---|---|---|---|
| 3,965,412 A | * | 6/1976 | Yungul | G01V 3/26 324/346 |
| 4,072,200 A | * | 2/1978 | Morris | E21B 7/04 175/45 |
| 4,456,891 A | * | 6/1984 | Fowks | H03L 7/26 315/267 |
| 4,706,388 A | * | 11/1987 | Van Steenwyk | E21B 47/022 33/304 |
| 4,712,306 A | * | 12/1987 | Cahill | E21B 47/022 33/304 |
| 4,833,787 A | * | 5/1989 | Van Steenwyk | E21B 47/022 33/302 |
| 4,834,493 A | * | 5/1989 | Cahill | G02B 6/2552 385/77 |

(Continued)

OTHER PUBLICATIONS

Bell, William E., et al., "Optical Detection of Magnetic Resonance in Alkali Metal Vapor", Physical Review, vol. 107, No. 6, (Sep. 15, 1957), pp. 1559-1566.

(Continued)

*Primary Examiner* — David Porta
*Assistant Examiner* — Djura Malevic
(74) *Attorney, Agent, or Firm* — John W. Wustenberg; Parker Justiss, P.C.

(57) ABSTRACT

Various systems and methods for implementing and using a downhole all-optical magnetometer include downhole all-optical magnetometer sensor, including optical receiving ports that receive light pulses, a depolarizer that depolarizes received light pulses, and a polarizer that polarizes depolarized light pulses from the depolarizer. The sensor further includes a vapor-filled cell through which polarized light pulses from the polarizer are directed, wherein interactions between vapor and a magnetic field within the vapor-filled cell alter at least some of the polarized light pulses, and an optical transmitting port that directs altered light pulses from the vapor-filled cell out of the sensor.

30 Claims, 7 Drawing Sheets

(56) References Cited

U.S. PATENT DOCUMENTS

| | | | | |
|---|---|---|---|---|
| 5,075,625 | A | * | 12/1991 | Augustin .................. G01V 3/26 |
| | | | | 324/346 |
| 6,648,083 | B2 | * | 11/2003 | Evans ...................... E21B 47/00 |
| | | | | 175/41 |
| 7,114,580 | B1 | * | 10/2006 | Balogh ................... E21B 47/022 |
| | | | | 166/255.2 |
| 7,675,030 | B2 | | 3/2010 | Vannuffelen et al. |
| 7,798,216 | B2 | * | 9/2010 | Phillips ................... E21B 23/08 |
| | | | | 166/254.2 |
| 8,278,923 | B2 | * | 10/2012 | Samson ................. E21B 47/024 |
| | | | | 324/300 |
| 8,334,690 | B2 | * | 12/2012 | Kitching ............ G01R 33/0286 |
| | | | | 324/301 |
| 8,836,327 | B2 | * | 9/2014 | French ................. G01R 33/032 |
| | | | | 257/421 |
| 9,091,785 | B2 | * | 7/2015 | Donderici ................ G01V 3/34 |
| 9,448,312 | B1 | * | 9/2016 | Kruspe ................... G01V 1/186 |
| 9,588,191 | B1 | * | 3/2017 | Kornev ............. G01R 33/0354 |
| 2007/0126594 | A1 | * | 6/2007 | Atkinson ............. E21B 47/123 |
| | | | | 340/853.1 |
| 2008/0175296 | A1 | | 7/2008 | Kumkar |
| 2009/0079426 | A1 | * | 3/2009 | Anderson ........ G01R 31/31709 |
| | | | | 324/301 |
| 2009/0256561 | A1 | | 10/2009 | Ledbetter et al. |
| 2010/0110422 | A1 | * | 5/2010 | Dennis ...................... G01J 3/02 |
| | | | | 356/301 |
| 2010/0225313 | A1 | * | 9/2010 | Blanz ..................... G01R 33/26 |
| | | | | 324/303 |
| 2010/0289491 | A1 | * | 11/2010 | Budker .................. G01R 33/26 |
| | | | | 324/304 |
| 2011/0025323 | A1 | * | 2/2011 | Budker .................. G01R 33/26 |
| | | | | 324/304 |
| 2011/0031969 | A1 | * | 2/2011 | Kitching ............ G01R 33/0286 |
| | | | | 324/304 |
| 2011/0297372 | A1 | * | 12/2011 | Maida, Jr. ............. E21B 47/024 |
| | | | | 166/255.2 |
| 2011/0298457 | A1 | | 12/2011 | Samson et al. |
| 2012/0046871 | A1 | * | 2/2012 | Naville ..................... G01V 1/42 |
| | | | | 702/17 |
| 2012/0059585 | A1 | * | 3/2012 | Kjerstad .................. G01V 3/12 |
| | | | | 702/6 |
| 2013/0027034 | A1 | * | 1/2013 | Elgort ..................... G01R 33/26 |
| | | | | 324/301 |
| 2013/0105224 | A1 | * | 5/2013 | Donderici ................ G01V 3/30 |
| | | | | 175/45 |
| 2014/0191120 | A1 | * | 7/2014 | Donderici ............. E21B 47/123 |
| | | | | 250/265 |
| 2014/0191761 | A1 | * | 7/2014 | San Martin ........... E21B 47/011 |
| | | | | 324/339 |

OTHER PUBLICATIONS

Budker, Dmitry et al., "Optical Magnetometry", Submitted to Nature Physics (Nov. 26, 2006), Cite as: arXiv:physics/0611246v1 [physics.atom-ph], (Feb. 2, 2008), 11 pgs.

Kitching, John et al., "Atomic Sensors—A Review", IEEE Sensors Journal, vol. 11, No. 9, (Sep. 2011), pp. 1749-1757.

Kitching, John et al., "Microfabricated Atomic Magnetometers and Applications", 2008 IEEE International, Frequency Control Symposium, (May 2008), pp. 789-794.

Knappe, S. et al., "Chip-Scale Room-Temperature Atomic Magnetometers for Biomedical Measurements", 5th European IFMBE Conference, Proceedings vol. 37, (Sep. 2011), pp. 1330-1333.

Mhaskar, Rahul R., et al., "Low-Frequency Characterization of MEMS-based Portable Atomic Magnetometer", 2010 IEEE International, Frequency Control Symposium, (Jun. 2010), pp. 376-379.

Preusser, J., et al., "A Microfabricated Photonic Magnetometer", Time and Frequency Division, National Institute of Standards and Technology (NIST), (NIST Website Online), Retrieved from the Internet URL http://tf.nist.gov/timefreq/general/pdf/2317.pdf, 3 pgs.

Preusser, Jan et al., "A Microfabricated Photonic Magnetometer", Time and Frequency Division, p. 1180-1182, NIST, Boulder, CO, USA, (NIST Website Online), Retrieved from Internet URL http://tf.boulder.nist.gov/general/pdf/2369.pdf.

Prouty, M., et al., "Small, Low Power, High Performance Magnetometers", EGM 2010 International Workshop, (Apr. 11-14, 2010), 5 pgs, Adding new value to Electromagnetic, Gravity and Magnetic Methods for Exploration, Capri, Italy.

Prouty, M., "Development of a Micro-Fabricated Total-Field Magnetometer", SERDP Project MR-1512 Final Report, Geometrics, Inc., Mar. 2011, pp. 1-175.

Prouty, M., "A Miniature Wide Band Atomic Magnetometer", SERDP Project MR-1568 Final Report, Geometrics, Inc., Dec. 2011, pp. 1-175.

Savukov, Igor "Ultra-Sensitive Optical Atomic Magnetometers and Their Applications", Advances in Optical and Photonic Devices, INTECH, Croatia, (Jan. 2010), pp. 329-352.

Seltzer, Scott J., "Developments in Alkali-Metal Atomic Magnetometry", A Doctoral Dissertation, (Nov. 2008), 331 pgs., Princeton University online, Retrieved from the Internet URL http://www.princeton.edu/physics/academics/graduate-program/theses/theses-from-2008/S.Seltzerthesis.pdf.

PCT International Search Report and Written Opinion, dated Jun. 24, 2013, Appl. No. PCT/US2013/032917, "Downhole All-Optical Magnetometer Sensor", filed Mar. 19, 2013, 14 pgs.

PCT International Preliminary Report on Patentability, dated Sep. 18, 2014, Appl No. PCT/2013/032917, "Downhole All-Optical Magnetometer Sensor," Filed Apr. 19, 2013, 26 pgs.

Jimenez-Martinez, Ricardo et al., "Sensitivity Comparison of Mx and Frequency-Modulated Bell-Bloom Cs Magnetometers in a Microfabricated Cell," IEEE Transactions on Instrumentation and Measurement, vol. 59, No. 2, pp. 372-378.

AU Patent Examination Report No. 1, dated Mar. 17, 2015, Appl No. 2013281227, "Downhole All-Optical Magnetometer Sensor," filed Mar. 19, 2013.

CA Examination Report, dated Jan. 19, 2017, Appl No. 2,874,596, "Downhole All-Optical Magnetometer Sensor," Filed Mar. 19, 2013.

CA Examination Report, dated Mar. 10, 2016, Appl No. 2,874,596, "Downhole All-Optical Magnetometer Sensor," filed Mar. 19, 2016.

* cited by examiner

DOWNHOLE ALL-OPTICAL MAGNETOMETER SENSOR

BACKGROUND

Oil field operators demand access to a great quantity of information regarding the parameters and conditions encountered downhole. A wide variety of logging tools have been and are being developed to collect information relating to such parameters as position and orientation of the bottom hole assembly, environmental conditions in the borehole, and characteristics of the borehole itself as well as the formations being penetrated by the borehole. One of the instruments sometimes incorporated into logging tools is a magnetometer. Magnetometers are used to measure the strength and direction of magnetic fields, and are used in logging tools to measure the Earth's magnetic field to determine both the position of the tool as well as to identify magnetic anomalies in the surrounding strata. Such anomalies can be indicative of petrochemical deposits or other minerals of interest.

But as the sensitivity of magnetometers has increased, so has the design complexity of these instruments. Electronic devices, such as those used to control and monitor magnetometers, produce electromagnetic fields that can interfere with the magnetometer itself. One class of magnetometers developed to address this issue (for use in both oil field and non-oilfield environments) has been all-optical magnetometers, which do not incorporate electrical or electronic devices in the sensor itself, relying instead on changes in the optical properties of light transmitted through a gas-filled cell within the sensor. One example is a Frequency Modulated Bell-Bloom (FM BB) magnetometer that uses a sensor with an alkali vapor cell interrogated by an FM laser. With such magnetometers, the optical emitters, optical receivers, and their associated electronics can be distanced away from the sensor, thus reducing interference with the magnetic fields of interest. The optical emitters and receivers of this configuration are coupled to the sensor using optical fibers.

However, all-optical magnetometer sensors require that the polarization of the interrogating light be maintained and this can be very difficult to achieve the over extremely long fiber lengths used to couple surface electronics to downhole sensors, which in drilling/logging environments can extend to several kilometers. Defects and bends over such lengths, even in high quality polarity maintaining fiber, can significantly degrade the polarization of the laser light, and absent sufficient polarization the sensor will not operate properly.

BRIEF DESCRIPTION OF THE DRAWINGS

Accordingly, there are disclosed in the drawings and the following description specific examples of logging systems and methods having downhole all-optical magnetometers. In the drawings.

Figure 1:
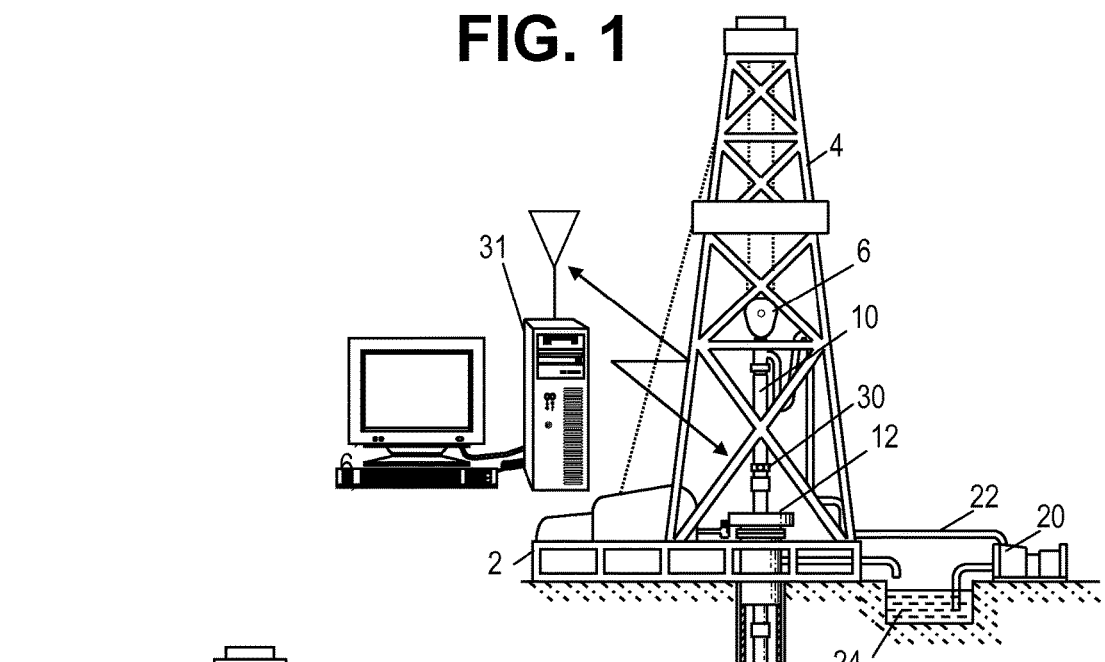
FIG. 1 shows an illustrative logging while drilling environment.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

The paragraphs that follow describe illustrative downhole all-optical magnetometer sensors and systems, and methods for using such sensors and systems. First, we present an overview of drilling and logging environments within which the described embodiments may be incorporated and used. This overview is followed by a detailed description of an illustrative downhole all-optical magnetometer system and an illustrative downhole all-optical magnetometer sensor. A micro-electro-mechanical systems (MEMS) embodiment of the downhole all-optical magnetometer sensor is also described. Two illustrative downhole all-optical magnetometer sensors suitable for use in sensor arrays are subsequently described, as well as an example of an array of such sensors. Finally, a description of an illustrative method of operating a downhole all-optical magnetometer system is described.

FIG. 1 shows an illustrative logging while drilling (LWD) environment. A drilling platform 2 supports a derrick 4 having a traveling block 6 for raising and lowering a drill string 8. A kelly 10 supports the drill string 8 as it is lowered through a rotary table 12. A drill bit 14 is driven by a downhole motor and/or rotation of the drill string 8. As bit 14 rotates, it creates a borehole 16 that passes through various formations 18. A pump 20 circulates drilling fluid through a feed pipe 22 to kelly 10, downhole through the interior of drill string 8, through orifices in drill bit 14, back to the surface via the annulus around drill string 8, and into a retention pit 24. The drilling fluid transports cuttings from the borehole into the pit 24 and aids in maintaining the borehole integrity.

An LWD tool 26 is integrated into the bottom-hole assembly near the bit 14. As the bit extends the borehole through the formations, logging tool 26 collects measurements relating to various formation properties as well as the tool orientation and various other drilling conditions. The logging tool 26 may take the form of a drill collar, i.e., a thick-walled tubular that provides weight and rigidity to aid the drilling process. In at least some embodiments, tool assembly 26 includes an illustrative downhole all-optical magnetometer used to track the position of logging tool 26 and to identify anomalies in the surrounding formations 18. Such embodiments, due to their increased sensitive relative to other magnetometers, may further use nuclear magnetic resonance (NMR) and electron spin resonance (ESR) techniques to perform electromagnetic interrogations of the surrounding formations 18.

A telemetry sub 28 may be included to transfer measurement data to a receiver within surface module 30 and to receive commands from the surface. In some embodiments, surface module 30 couples to the downhole all-optical magnetometer via fiber optic cables, and further communicates wirelessly with surface computer system 31 so as to allow surface module 30 to rotate together with drill string 8 (as shown in FIG. 1). In other embodiments, the fiber optic cables coupled to the downhole all-optical magnetometer are coupled to surface computer system 31 through rotary optical couplers (not shown).

Figure 2:
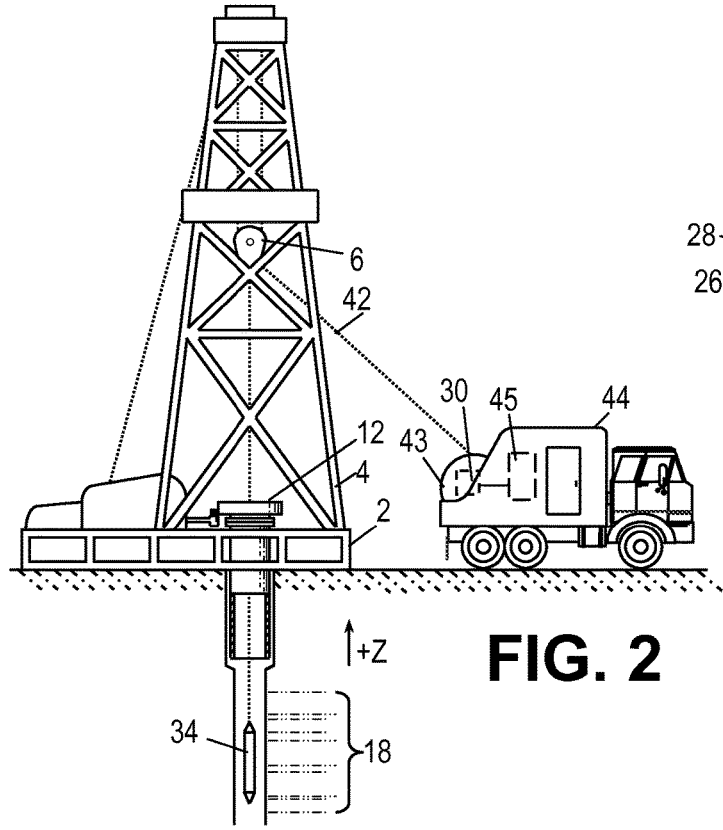
FIG. 2 shows an illustrative wireline logging environment.

At various times during the drilling process, the drill string 8 may be removed from the borehole as shown in FIG. 2. Once the drill string has been removed, logging operations can be conducted using a wireline logging tool 34, i.e., a sensing instrument sonde suspended by a cable 42 deployed from reel 43 and having conductors and fiber optic cables for transporting optical control and probe signals to the tool and telemetry from the tool to the surface. A wireline logging tool 34 may have pads and/or centralizing springs (not shown) to maintain the tool near the axis of the borehole as the tool is pulled uphole. In at least some embodiments, tool 34 includes an illustrative downhole all-optical magnetometer used to track the position of tool 34 and to identify anomalies in, and/or characteristics of, the surrounding formations 18. A surface logging facility 44 collects measurements from the logging tool 34, and includes a surface module 30 coupled to spool 43 and a computer system 45 for processing and storing the measurements gathered by the logging tool. In at least some embodiments, surface module 30 couples wirelessly to computer system 45 to allow surface module 30 to rotate together with spool 43 (as shown in FIG. 2). In other embodiments surface system 30 is part of computer system 45 and couples to the fiber being reeled off spool 43 via rotary optical couplers (not shown).

Figure 3:
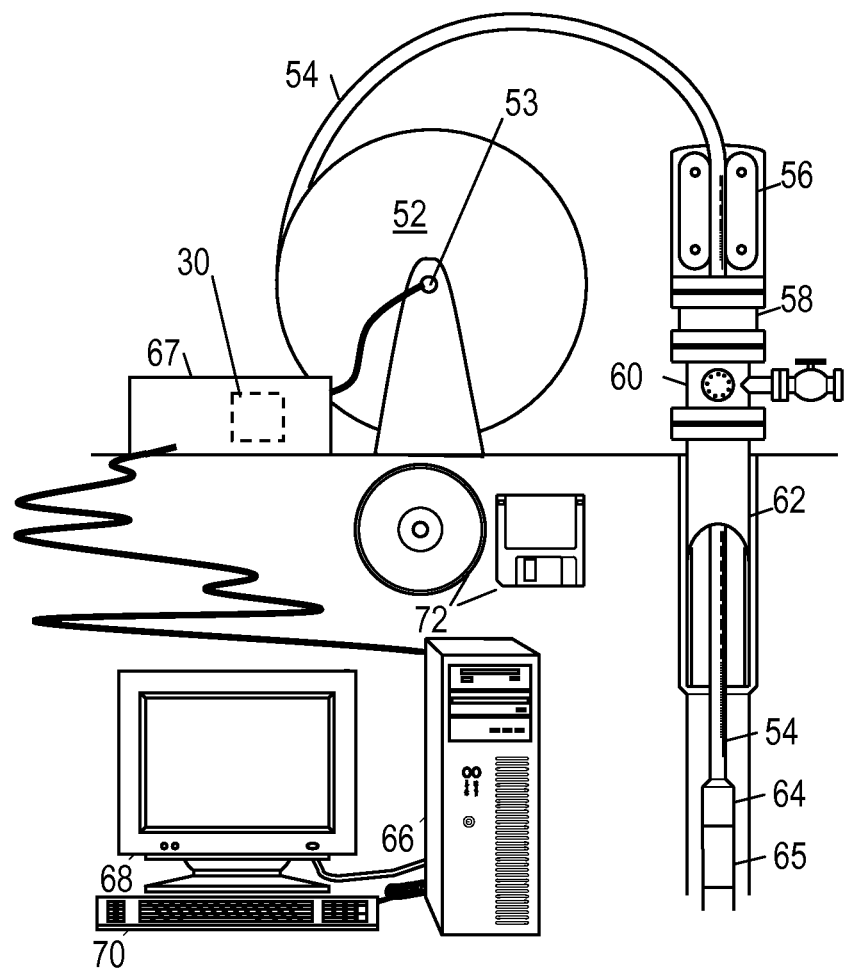
FIG. 3 shows an illustrative tubing-conveyed logging environment.

An alternative logging technique is logging with coil tubing. FIG. 3 shows an illustrative coil tubing-conveyed logging system in which coil tubing 54 is pulled from a spool 52 by a tubing injector 56 and injected into a well through a packer 58 and a blowout preventer 60 into the well 62. (It is also possible to perform drilling in this manner by driving the drill bit with a downhole motor.) In the well, a supervisory sub 64 and one or more logging tools 65 are coupled to the coil tubing 54 and optionally configured to communicate to a surface computer system 66 via optical fibers which, in some embodiments, are embedded in the tubing wall. An uphole interface 67 may be provided to exchange communications with the supervisory sub and receive data to be conveyed to the surface computer system 66. In at least some embodiments, surface system 30 is part of uphole interface 67 and couples to the fiber being reeled off spool 52 via a rotary optical coupler 53. In other embodiments a surface system 30 attaches to spool 52 so it can rotate together with the spool, and communicates wirelessly with uphole interface 67 (not shown).

Surface computer system 66 of FIG. 3 is configured to communicate with supervisory sub 64 during the logging process or alternatively configured to download data from the supervisory sub after the tool assembly is retrieved. Surface computer system 66 is preferably configured by software (shown in FIG. 3 in the form of removable storage media 72) to process the logging tool measurements. System 66 includes a display device 68 and a user-input device 70 to enable a human operator to interact with the system software 72.

In each of the foregoing logging environments, the logging tool assemblies preferably include a navigational sensor package that includes directional sensors for determining the inclination angle, the horizontal angle, and the rotational angle (a.k.a. "tool face angle") of the bottom hole assembly. As is commonly defined in the art, the inclination angle is the deviation from vertically downward, the horizontal angle is the angle in a horizontal plane from true North, and the tool face angle is the orientation (rotational about the tool axis) angle from the high side of the borehole. In accordance with known techniques, directional measurements can be made as follows: a three axis accelerometer measures the earth's gravitational field vector relative to the tool axis and a point on the circumference of the tool called the "tool face scribe line". (The tool face scribe line is typically drawn on the tool surface as a line parallel to the tool axis.) From this measurement, the inclination and tool face angle of the logging assembly can be determined. Additionally, a three axis magnetometer (which may include at least some of the embodiments described herein) measures the earth's magnetic field vector in a similar manner. From the combined magnetometer and accelerometer data, the horizontal angle of the logging assembly can be determined. These orientation measurements, when combined with measurements from motion sensors, enable the tool position to be tracked downhole.

Figure 4:
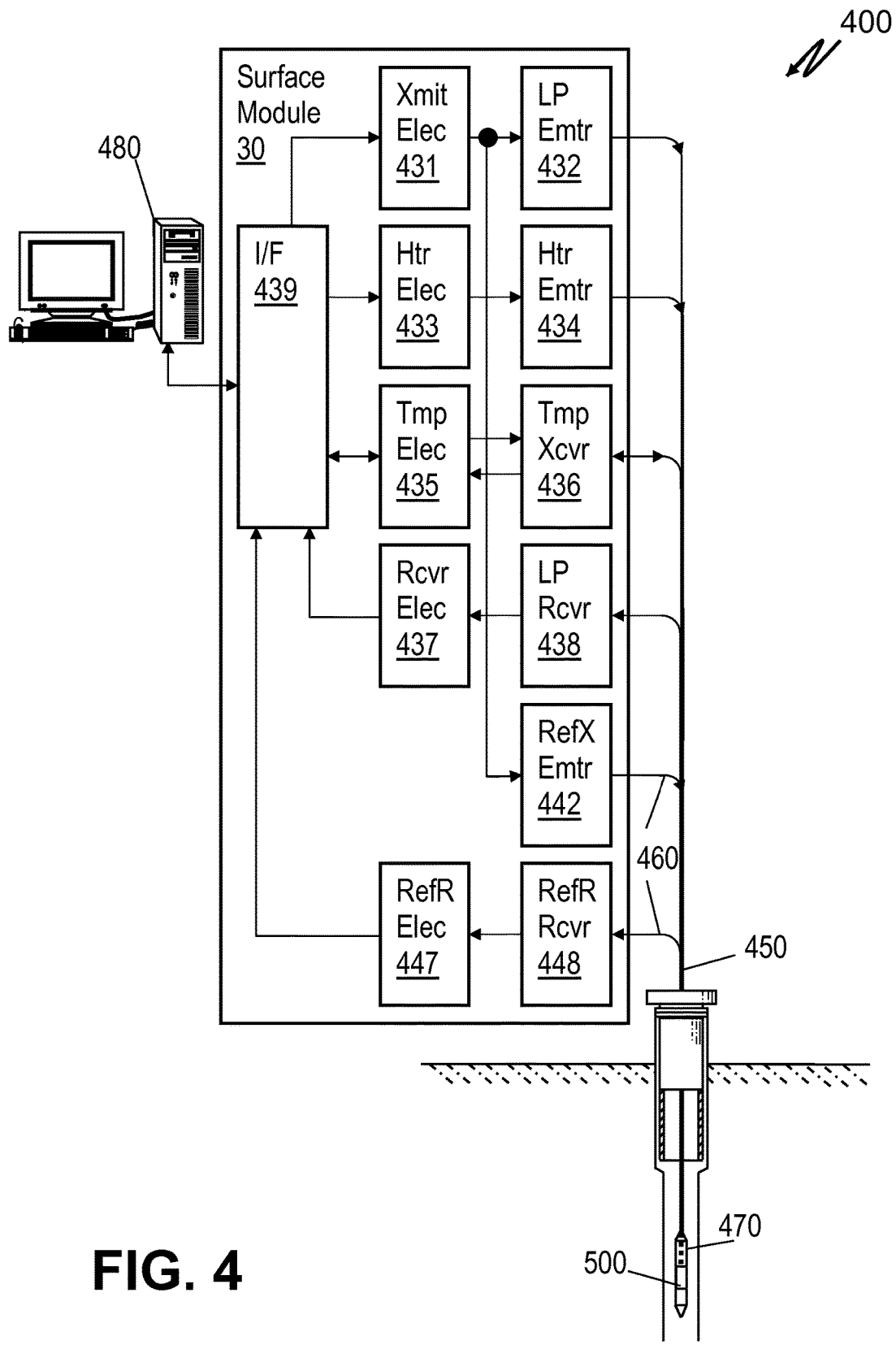
FIG. 4 shows an illustrative downhole all-optical magnetometer system.

One system that may be at least partially incorporated into a logging tool to collect data from wells as previously described is the illustrative downhole all-optical magnetometer system shown in FIG. 4. A surface module 30 and a downhole sensor module 500 within a logging tool 470 are shown coupled to each other by optical fiber bundle 450. This configuration reduces the number of specialized electronic components included within logging tool 470 and capable of handling downhole environments, since the electronic components associated with the illustrative downhole all-optical magnetometer system are housed within surface module 30 (e.g., optical emitters and receivers, data processors, etc.). Optical fiber bundle 450 includes a loadbearing element (e.g., a steel cable) configured such that the optical fibers themselves carry little if any of the mechanical load (i.e., the combined weight of logging tool 470 and of optical fiber bundle 450). This may be accomplished, for example, by coiling the optical fibers around the steel cable, without exceeding the bend radius of the fibers, and covering the coiled fibers and steel cable with a protective sheath (e.g., a Kevlar® sheath).

The illustrative downhole all-optical magnetometer system of FIG. 4 further includes a computer system 480 (similar to computer system 66 of FIG. 3) coupled to interface (I/F) 439, which in turn couples to transmitter electronics (Xmit Elec) module 431, heater electronics (Htr Elec) module 433, temperature electronics (Tmp Elec) module 435, receiver electronics (Rcvr Elec) module 437 and reference receiver electronics (RefR Elec) module 447. Transmitter electronics module 431 receives signals from interface 439 that operate to control light pulse emitter (LP Emtr) 432, also coupled to electronics module 431. Light pulse emitter 432 generates light pulses altered by downhole module 500 to provide optical detection of magnetic fields surrounding the downhole module, as described in more detail below.

Figure 5:
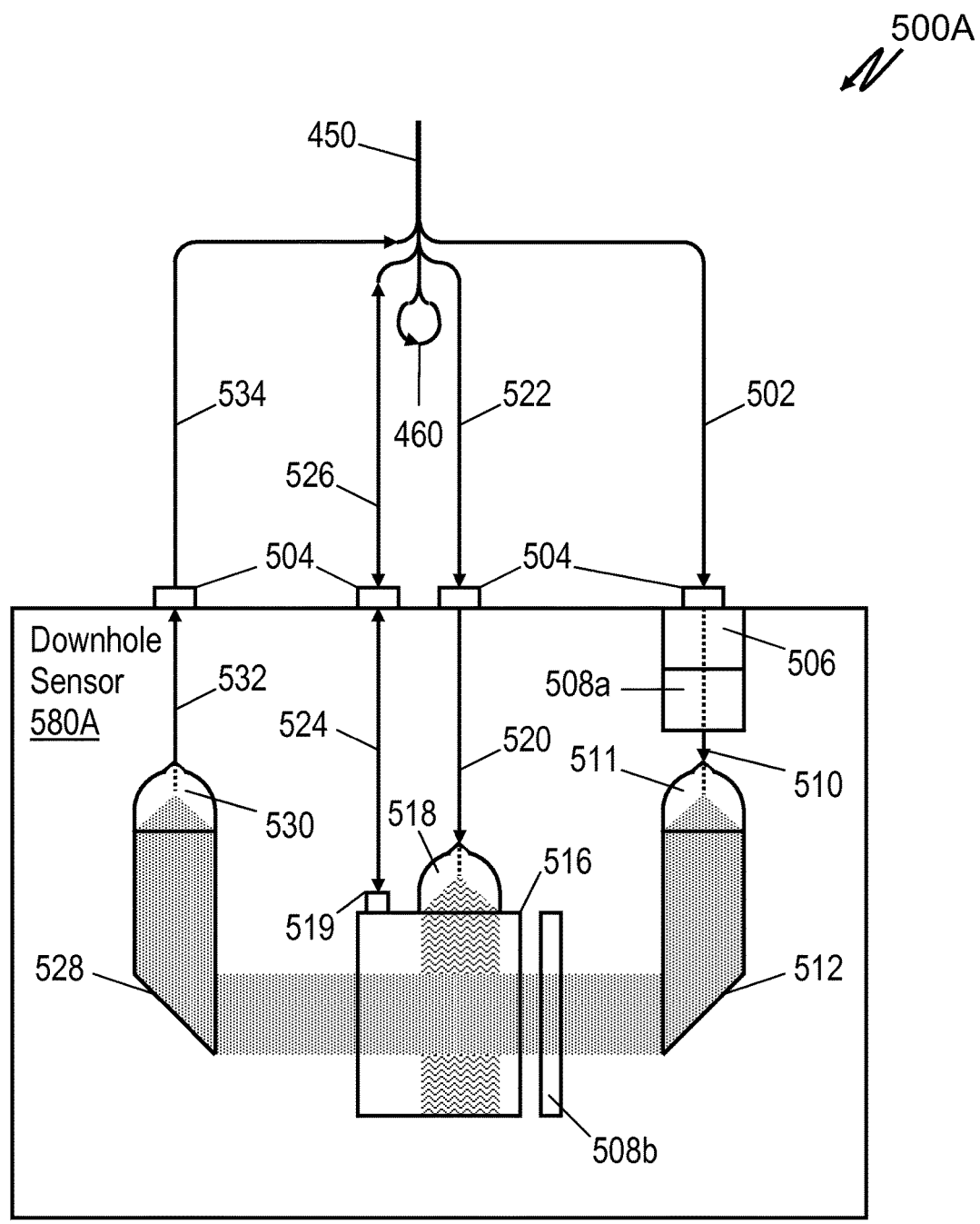
FIG. 5 shows a detailed view of an illustrative downhole all-optical magnetometer sensor.

Characteristics of the light pulses are altered as they pass through downhole sensor module 500, producing altered light pulses that are received and detected by light pulse receiver (LP Rcvr) 438. Receiver electronics module 437 receives signals from light pulse receiver 438 representative of the altered light pulses, and generates corresponding electronic signals that are transmitted to interface 439 for further processing by computer system 480. To account for alterations to the light pulses that are due to the length of the optical fibers (which can be several kilometers in length), effects of bends in fiber bundle 450 and fluctuations in emitter power, a reference fiber may be added to fiber bundle 450 that forms a loop through downhole module 500 (as shown in FIG. 5). Reference fiber loop 460 couples reference emitter (RefX Emtr) 442 (also driven by transmitter electronics module 431) to reference receiver (RefR Rcvr) 448, which couples to reference receiver electronics (RefR Elec) module 447. Reference receiver electronics module 447 transmits signals (representative of the light pulses sent through reference fiber loop 460) to interface 439 for further processing by computer system 480 (e.g., for subtraction from the signal presented by optical receiver electronics module 437 to produce a difference signal representative of the alterations produced by the magnetic field).

Surface module 30 of FIG. 4 also includes heater electronics (Htr Elec) module 433 and temperature electronics (Tmp Elec) module 435, which respectively couple to heater emitter (Htr Emtr) 434 and temperature transceiver (Tmp Xcvr) 436. Heater electronics module 433 sends signals to heater emitter 434 to control light generated by the heater emitter (e.g., by pulse width modulating light pulses generated by an alkali vapor laser embodiment of heater emitter 434). The light pulses from heater emitter 434 operate to heat the vapor within vapor-filled cell 516 of FIG. 5. In at least some illustrative embodiments, a thermal conductive structure (not shown) is included that thermally couples vapor-filled cell 516 to the exterior of the tool within which it is housed. This structure conducts environmental heat from outside the downhole sensor (e.g., from the borehole environment outside the tool) to the vapor-filled cell to provide an alternate/additional source of heat for heating the vapor within vapor-filled cell 516 to the desired temperature.

Temperature electronics module 435 receives signals from temperature transceiver 436, which generates and transmits a reference temperature probe light pulse and also receives reflected or backscattered light (depending upon the temperature sensor(s) used). The reflected/backscattered light is representative of the temperature of a vapor-filled cell within downhole sensor 500 (heated by the light generated by heater emitter 434), and both the temperature probe light pulses and reflected/backscattered light are directed through one of the optical fibers in optical fiber bundle 450. The computer system 480, one or more downhole optical temperature sensors (coupled to temperature transceiver 436 through another optical fiber within optical fiber bundle 450), the heater electronics and emitter, and the temperature electronics and transceiver together form a control loop that enables computer system 480 to regulate the temperature of the vapor-filled cell. The measured temperature also may be used by computer system 480 to provide temperature compensation of downhole sensor 500 signal data.

A detailed view of an illustrative downhole module 500 (500A) coupled to the downhole end of optical fiber bundle 450 is shown in FIG. 5. Referring to both FIGS. 4 and 5, optical fiber bundle 450 splits out into six optical fiber runs, though the figure shows only five actual optical fibers in the illustrative embodiment. One of the optical fibers is reference fiber 460, which runs the length from reference emitter 442 of surface module 30 to downhole module 500A, then loops back as shown and again runs the length of the borehole from downhole module 500A to reference receiver 448 of surface module 30. The remaining four fibers couple to optical ports 504 of downhole sensor 580A.

Optical fiber 502 couples light pulse emitter 432 to one of the optical ports 504, in turn coupled to depolarizer 506. Depolarizer 506 couples to polarizer 508a, which in at least some illustrative embodiments linearly polarizers the depolarized light received from depolarizer 506. The use of a depolarizer/polarizer combination ensures that light of a known polarization is used within downhole sensor 580A, regardless of the degree of polarization of the light generated by light pulse emitter 432 or the degree of depolarization induced by optical fiber 502. Further, because depolarization by optical fiber 502 is not a concern, less expensive fiber can be used for optical fiber 502 (as well as for the other fibers) than would otherwise be required if it were necessary to maintain the polarization of the light generated by light pulse emitter 432.

A polarization maintaining optical waveguide 510 couples polarizer 508a to gradient-index (GRIN) lens 511. GRIN lenses incorporate a gradual variation of the refractive index of the material of which they are made, which produces a lens with a flat surface and also avoids the aberrations of some spherical lenses, though GRIN lenses may have refraction gradients other than spherical refraction gradients (e.g., axial, radial or parabolic). In at least some illustrative embodiments, this flat surface enables the lens to be attached to the end of an optical fiber, though in other illustrative embodiments the lens may be positioned at the end of other types of optical waveguides (e.g., deep etched trench planar optical waveguides within a MEMS downhole sensor 580A), as explained in more detail below. Nonetheless, other types of lenses may be used, and all such lenses are within the scope of the present disclosure. The light focused by GRIN lens 511 is then reflected off of mirror 512 towards polarizer 508b and vapor-filled cell 516.

Vapor-filled cell 516 contains an alkali metal that is heated to bring the metal to a gaseous state. In at least some illustrative embodiments, a temperature range from 80° C. to 260° C. is preferred, though a higher temperature within this range may be desirable to increase the measurable magnetic field bandwidth while reducing the sensitivity of the downhole sensor. It is well known that sensitivity, bandwidth, and size are interrelated complementary features of an atomic magnetometer. The sensitivity of the magnetometer depends on how uniformly the alkali valence electrons process in phase with the driving field that produces a measurable magnetic moment, which is detectable with a probe beam. Collisions are decoherence events that ultimately decrease the sensitivity of the magnetometer. These collisions are between the alkali atoms and the vapor cell walls as well as temperature-dependent collisions between the vaporized alkali atoms. A small vapor cell will result in larger atom-wall collisions and therefore resulting in a larger decoherence rate. A higher temperature vapor results in a larger rate of collisions between alkali vapor atoms which also results in a larger decoherence rate. A larger decoherence rate from these collisions broadens the spectral lines, increasing the measurable magnetic field bandwidth while sacrificing the sensitivity of the downhole sensor.

Once the metal is heated and vaporized, the vapor within vapor-filled cell 516 is illuminated with a first light pulse from a coherent light source, referred to as a "pump pulse," at or near the resonant wavelength of the vapor. For example, if the vapor-filled cell contains a cesium vapor, a light emitting diode (LED) pumped cesium vapor laser can be used as light pulse emitter 342 to produce a light at or near the appropriate resonant wavelength. Techniques for varying the wavelength of the light produced by such emitters are well known in the art and not discussed further. Also, those of ordinary skill in the art will recognize many other types of emitters suitable for use as light pulse emitter 342, and all such emitters are within the scope of the present disclosure. Further, although cesium is used in the example presented, any of a number of alkali metals may be used (e.g., potassium, rubidium, etc.), and all such alkali metals are within the scope of the present disclosure.

Exposing the vapor to the pump pulse polarizes the alkali vapor with light that is resonant with the alkali D1 optical transition, $ns_{1/2} \rightarrow np_{1/2}$. In at least some embodiments, a buffer gas (e.g., nitrogen) is included within the vapor-filled cell to broaden the D1 transition, causing the hyperfine structure to be unresolved and increasing the measurable magnetic field bandwidth, thus also improving the sensitivity of the downhole sensor. The addition of one or more buffer gases further has a spin anti-relaxation effect, as does the addition of an anti-relaxation coating to the inner surfaces of vapor-filled cell 516. Such anti-relaxation measures may be utilized where high magnetic field sensitivity is desired but low bandwidth (e.g., below 100 Hz) is acceptable.

The pump pulse, which has been linearly polarized as previously described by polarizer 508a, is circularly polarized by polarizer 508b before the pulse enters vapor-filled cell 516. In at least some illustrative embodiments, polarizer 508b is implemented using a quarter wave plate. The circularly polarized light transfers angular momentum from the photons to the vapor atoms, resulting in a spin-polarized vapor. This vapor exhibits macroscopic magnetization and this magnetization processes in an ambient magnetic field at the Larmor frequency of the magnetic field for the particular alkali vapor used. The Larmor frequency is determined by the gyromagnetic ratio of the vapor (different for each nucleus of different atoms, but well known for most nuclei) and by the strength of the magnetic field (the parameter being measured).

After exposing the vapor to the pump pulse, the vapor is exposed to a "probe pulse" with a varying wavelength that is modulated at a varying range of frequencies until the Larmor frequency of the vapor and magnetic field is identified, for example, by detecting a resonance of the atomic magnetization as the varying frequency passes through the Larmor frequency. More specifically, at or near the Larmor frequency (or at multiples or submultiples of the Larmor frequency) a precession of the atomic spins is induced, and that precession reaches a local maximum at that frequency. Once the Larmor frequency is identified, the magnetic field strength may be derived analytically from the Larmor frequency (e.g., by computer system 480 of FIG. 4).

In at least some illustrative embodiments, the pump pulse and the probe pulse are both generated by light pulse emitter 432, and thus follow the same optical path and are both circularly polarized. This configuration is sometimes referred to as a "Bell-Bloom" configuration. In other illustrative embodiments (not shown), separate light pulse emitters are used for each of the pump and probe pulses and separate optical fibers are used to direct these two light pulses to the vapor-filled cell (though both light pulses pass through a depolarizer/polarizer, either separate or monolithic). The pump pulse and the probe pulse are directed at the vapor-filled cell through separate optical paths, with the pump pulse being directed through circular polarizer 508b, but probe pulse optionally being directed at the vapor-filled cell without further polarization or through a different polarizer. In still other illustrative embodiments, the pump and probe pulses are circularly polarized separately such that they are orthogonal to each other. Many different types of polarizations of the probe pulse suitable for use with the disclosed downhole sensors will become apparent to those of ordinary skill in the art, and all such probe pulse polarizations are within the scope of the present disclosure.

The excitation of the vapor by the probe pulse causes energy to be transferred from the probe pulse to the vapor atoms, altering the characteristics of the probe pulse as it passes through vapor-filled cell 516, optical waveguide 532 (via mirror 528), optical port 504 and optical fiber 534 which couples to light pulse receiver 438 on the surface. Alterations to the probe pulse may be detected as absorption or dispersion of the probe pulse light, as polarization rotations of the probe pulse light, or as alterations in the shape of the probe pulse waveforms. In at least some illustrative embodiments, the point of maximum absorption (and thus the magnetic field strength from the Larmor frequency) can be determined by comparing received altered light pulses with light pulses from the same emitter that are concurrently directed through a reference fiber (as previously described). Computer system 480 may perform this operation, for example, by subtracting a reference signal (representative of the light pulse received through reference fiber 460) from the altered light signal (representative of the altered light pulses received through optical fiber 534). The resulting difference may be further processed by the computer system or presented to the user as, for example, a two-dimensional graph. Such two-dimensional graphs or well logs show the measured parameter as a function of tool position or depth, and in some embodiments also as a function of rotational angle. In these two-dimensional images of the borehole wall, one dimension represents tool position or depth, the other dimension represents azimuthal orientation, and the pixel intensity or color represents the parameter value.

In other illustrative embodiments, the waveform of the received light is analyzed to determine the point of maximum spin precession (and thus magnetic field strength). In such an embodiment, light pulse receiver 438 and receiver electronics module 437 are part of an interferometer, and the light pulses also include a series of initial reference pulses (preceding the pump pulses) used to calibrate the interferometer. Signals generated by such an interferometer (representative of the alterations to the light pulses caused by the spin precession) are transmitted to computer system 480 for further analysis and a determination of the point of maximum spin precession (and thus the magnetic field strength).

Continuing to refer to FIGS. 4 and 5, as previously described, surface module 30 includes heater emitter 434, which is coupled to downhole sensor 580A by optical fiber 522. One of the optical ports 504 couples optical fiber 522 to optical waveguide 520, which directs the heating light pulses to GRIN lens 518. GRIN lens 518 spreads out the light within vapor-filled cell 516 and heats up the vapor. The temperature of the vapor may be monitored using any of a number of temperature sensors, including but not limited to point sensors such as scanning fiber Fabry-Perot and fiber Bragg grating sensors, as well distributed sensors such as fiber Raman scattering sensors. The illustrative embodiment of FIG. 5 uses a point sensor 519 mounted on vapor-filled cell 516, and is coupled by an optical waveguide 524 to optical fiber 526 through one of the optical ports 504. Optical fiber 526 couples downhole sensor 580A to temperature transceiver 436, which both transmits a temperature probe pulse and receives reflected or backscattered light pulses (depending on the type of sensor used) that vary depending on the temperature of the vapor within vapor-filled cell 516. The above-described temperature sensors are well-known in the art and are not discussed further.

It should be noted that in describing illustrative downhole sensor 580A, optical paths within the sensor are describe as optical waveguides rather than optical fibers. While optical fibers would be suitable for these optical paths, other embodiments may make use of alternate structures to form the desired optical waveguide. For example, in at least some illustrative embodiments of downhole sensor 580A, the sensor is manufactured using MEMS technology. In such an embodiment, one technique for providing an optical path is by forming a deep etched trench planar optical waveguide between the two elements that are being optically coupled. The use of such small structures enables the production of embodiments of downhole sensor 580A below one cm$^3$, with sensors below one mm$^3$ being feasible using existing MEMS technology.

Figure 6A:
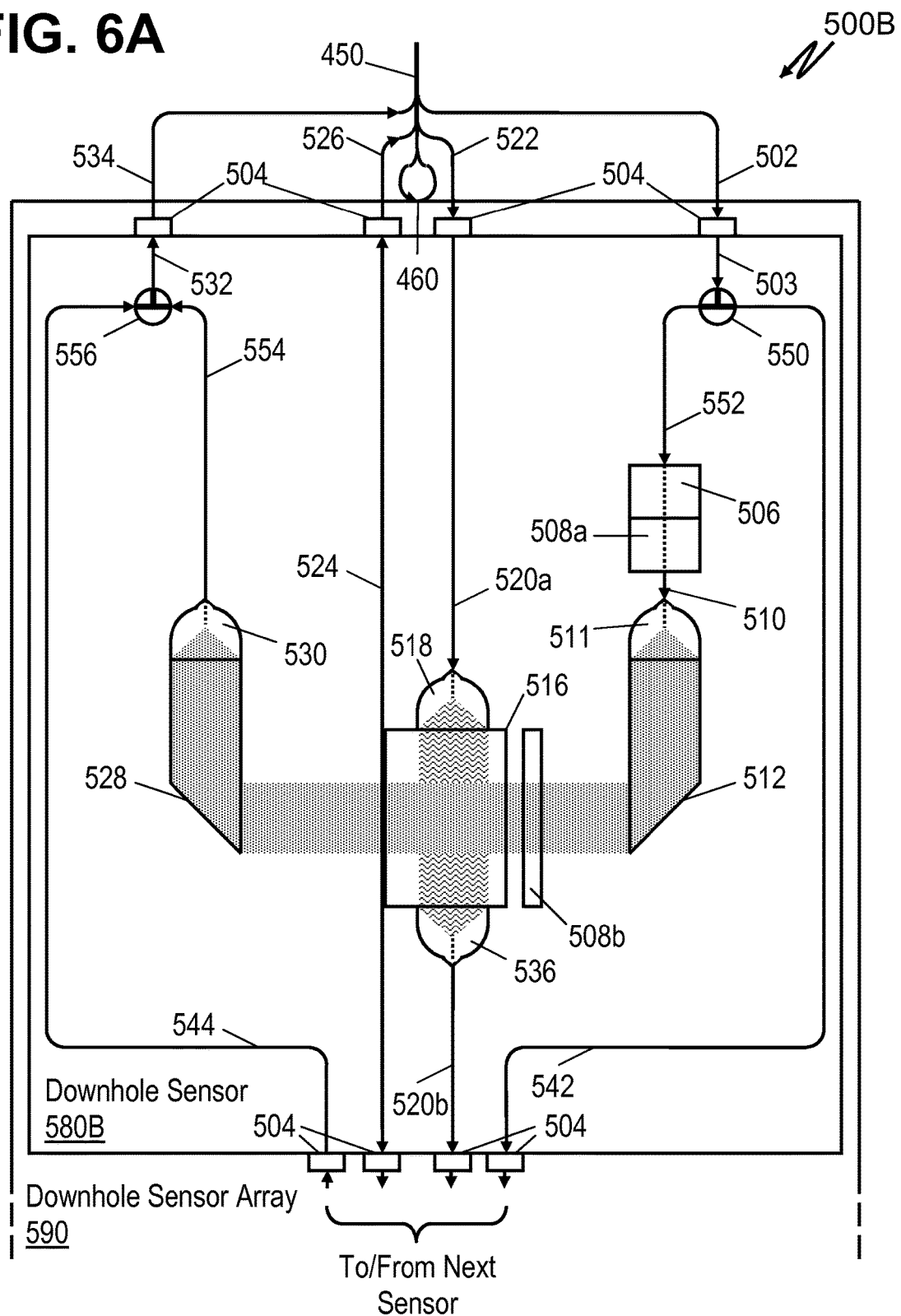
FIGS. 6A and 6B each shows a detailed view of an illustrative downhole all-optical magnetometer sensor suitable for use within a sensor array.
Figure 6B:
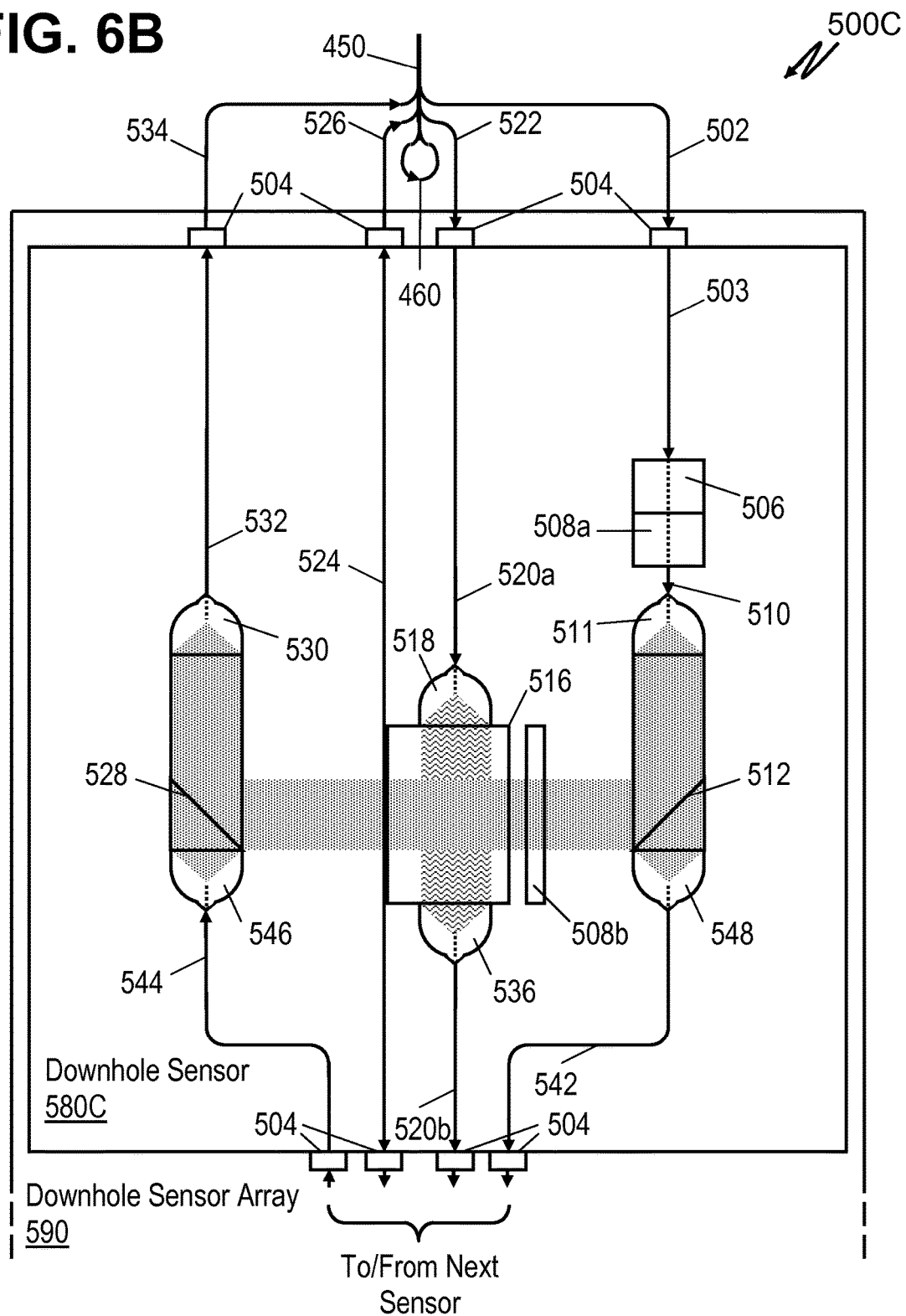

Other illustrative embodiments of a downhole sensor may be suitable for use within a sensor array distributed along the length of at least part of a drillstring, along the length of a logging tool or along the length of at least part of a cable or tubing coupled to a logging tool. FIGS. 6A and 6B show two examples of a downhole sensor array 590 with sensors chained in a ladder formation, each sensor array using different downhole sensor embodiments. In downhole sensor 580A of FIG. 6A, splitter/combiner 550 (coupled to an optical port 504 by optical waveguide 503) is used to distribute the incoming pump/pulse light pulses (either equally or disproportionately) between depolarizer 506 (via optical waveguide 552) and a splitter/combiner 550 of the next downhole sensor 580B in the ladder (via optical waveguide 542 and an optical port 504). Splitter/combiner 556 similarly combines the altered light pulses received from a splitter combiner 556 of the next downhole sensor 580B in the ladder (via optical waveguide 544 and an optical port 504) and the altered light pulses from GRIN lens 530 (via optical waveguide 554) and directs the combined altered light pulses to surface module 30 via optical waveguide 532 (or to the next downhole sensor if not the top sensor in the ladder).

Heater light pulses are forwarded through the addition of GRIN lens 536, which focuses the heater light pulses within vapor-filled cell 516 for transmission through optical waveguide 520b (which continues into the next downhole sensor 580B in the ladder as optical waveguide 520a via an optical port 504). In other illustrative embodiments (not shown), GRIN lens 536 is omitted and a splitter/combiner similar to splitters/combiners 550 and 556 splits the heater light pulses received via optical waveguide 520a between grin lens 518 and optical waveguide 520a of the next downhole sensor (via an optical port 504). In the illustrative embodiment shown, temperature optical waveguide 524, which operates as a distributed temperature sensor, is attached to at least one wall of some or all of the vapor-filled cells 516 within the array, passing from cell-to-cell via optical ports 504 and operating in a manner similar to that of temperature sensor 519 and optical waveguide 524 of FIG. 5. In such a distributed sensor a light pulse is transmitted down optical waveguide 524 and backscatter is directed back up the optical waveguide to surface module 30 (or the next downhole sensor if not the top sensor in the ladder). This Backscatter is generated as a result of Raman scattering within optical waveguide 524 as the light pulse travels down the optical waveguide and traverses some or all of the downhole sensor 580B within sensor array 590. In the frequency domain, the backscattered light will include a Rayleigh peak at the same frequency as the original light pulse, and two other peaks, known as the Stokes and anti-Stokes lines, slightly offset in frequency from the Rayleigh peak. The anti-Stokes line is strongly temperature dependent, and the intensity of the anti-Stokes line normalized by the intensity of the Stokes line is unambiguously related to temperature. In all other regards, operation of downhole sensor 580B is the same as described above for downhole sensor 580A.

Downhole sensor 580C of FIG. 6B is similar to downhole sensor 580B, but includes additional GRIN lenses 546 and 548. Also, mirror 528 is a one-way mirror and mirror 512 is a partially reflective mirror. Mirror 512 (operating as an optical splitter) allows some of polarized light pulses to pass through it, where it is refocused by GRIN lens 548, while the rest of the polarized light pulses are directed to the next downhole sensor 580 in the ladder by optical waveguide 542 (via an optical port 504). Similarly, optical waveguide 544 directs altered light pulses from the next downhole sensor 580B in the ladder (via an optical port 504) to the back of mirror 528 (operating as an optical combiner), which passes through the mirror to combine with the light pulses from the vapor-filled cell 516. The combined altered light pulses are then directed by optical waveguide 532 to surface module 30 (or the next downhole sensor if not the top sensor in the ladder). In all other regards, operation of downhole sensor 580C is the same as that described above for downhole sensor 580B.

Figure 7:
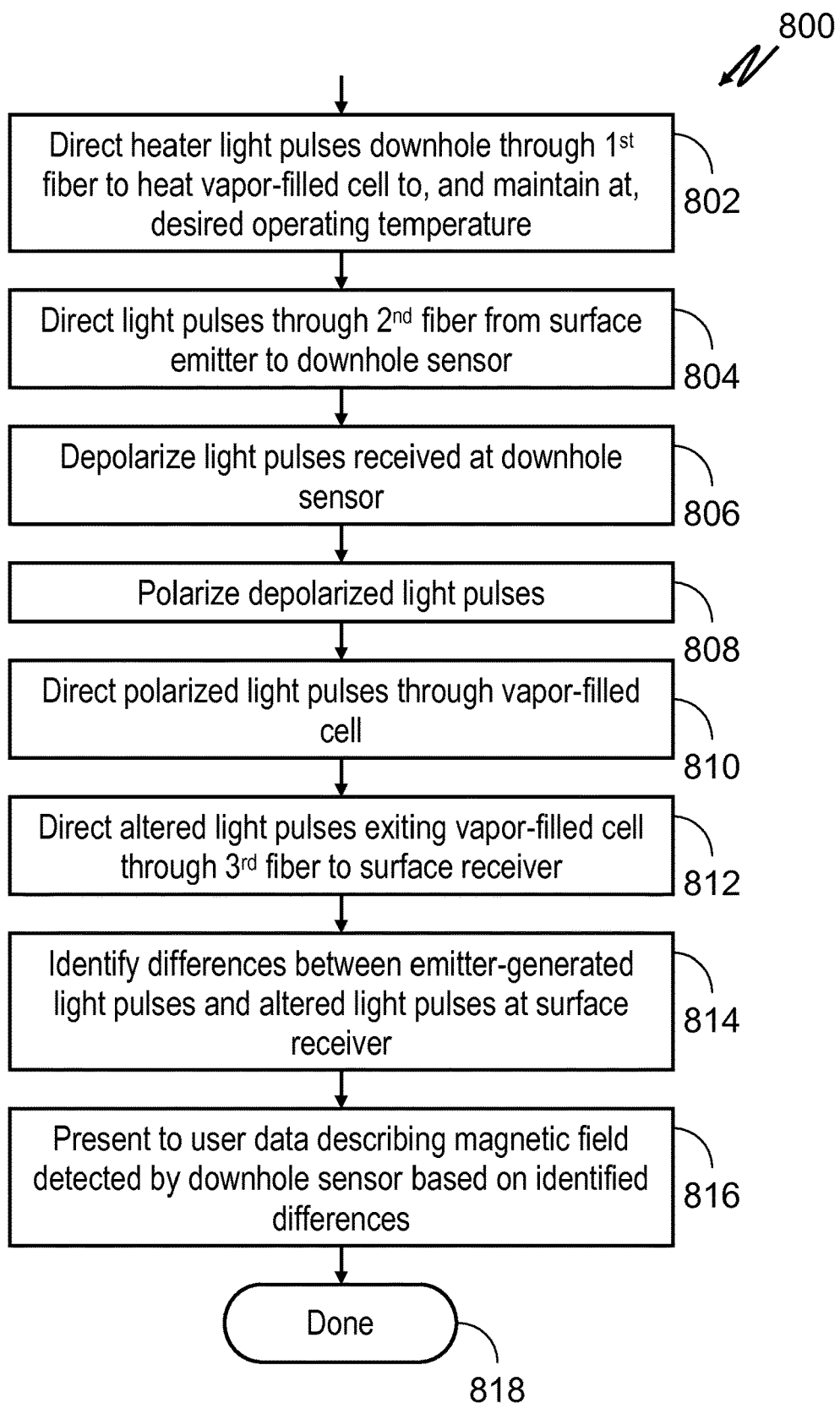
FIG. 7 shows an illustrative method for operating a downhole all-optical magnetometer.

FIG. 7 shows an illustrative method 800 for operating a downhole all-optical magnetometer system that incorporates downhole sensors and/or sensor arrays such as those described above. Heater emitter light pulses generated at the surface of a borehole are directed downhole through a first optical fiber to one or more downhole sensors (block 802) to heat a vapor-filled cell within each downhole sensor up to, and maintain at, it's operating temperature. The temperature of the cells is optically monitored and the monitored temperature is value used as part of a control loop to maintain the temperature within a desired range. Once the vapor-filled cell of the sensor(s) is within a desired operating temperature range, light pulses that include at least one pump pulse and one or more probe pulses are directed downhole through a second optical fiber (block 804), where the received light pulses are depolarized (block 806) and then polarized (block 808). In at least some illustrative embodiments, the polarization of block 808 is a two-step process that includes a first linear polarization of both the depolarized pump and probe pulses, followed by a circular polarization of the pump pulses which are then directed through the vapor-filled cell (block 810). The linearly polarized probe pulses may be directed to the vapor-filled cell without further polarization, further circularly polarized together with the pump pulses and then directed through the vapor-filled cell, or further separately polarized in some other manner and then directed through the vapor-filled cell (block 810). Light pulses altered by the vapor-filled cell are directed through a third optical fiber to a surface receiver (block 812), and differences between the emitter-generated light pulses and the altered light pulses are identified (block 814). The user is presented data that is based upon the identified differences and is representative of the magnetic field detected by the downhole sensor (block 816), ending the method (block 818).

Numerous other modifications, equivalents, and alternatives, will become apparent to those skilled in the art once the above disclosure is fully appreciated. For example, while some of the illustrative embodiments described above included splitter/combiners with 1-to-2/2-to-1 configurations other splitter/combiners may be used (e.g., 1-to-N/N-to-1) to enable a downhole sensor to optically couple to more than one other downhole sensor. Similarly, those embodiments that use modified mirrors and additional GRIN lenses may use a larger number of GRIN lenses to also enable a downhole sensor to optically couple to more than one other downhole sensor. At least some illustrative embodiments may further combine these configurations. Additionally, splitter/combiners may be incorporated into the downhole modules described outside of the downhole sensors but within the downhole sensor arrays described to optically couple multiple sensors, and/or outside of the sensor array to optically couple multiple sensor arrays (forming, e.g., arrays of arrays). As before, combinations of all of these configurations are also possible. Further, when incorporated into tools that include other sensors that may produce electromagnetic interference, the described embodiments and other sensors may be configured such that the downhole all-optical magnetometer sensor/sensor array is shielded from the other sensors, and/or the other sensors are either powered down or set to a low power idle state when the magnetometer system is sampling the magnetic field. Also, although the embodiments of the present disclosure are described within the context of well logging or logging while drilling environments, it is also possible to permanently install the downhole all-optical magnetometers and optical fibers described within the casing of a completed wellbore. It is intended that the following claims be interpreted to embrace all such modifications, equivalents, and alternatives where applicable.

What is claimed is:

1. A downhole all-optical magnetometer sensor, the sensor comprising:
    one or more optical receiving ports that receive a plurality of polarized light pulses from one or more optical fibers;
    a depolarizer, coupled to the one or more optical receiving ports, that depolarizes the plurality of received polarized light pulses;
    a polarizer coupled to the depolarizer that polarizes depolarized light pulses from the depolarizer;
    a vapor-filled cell through which polarized light pulses from the polarizer are directed, wherein interactions between vapor and a magnetic field within the vapor filled cell alter at least some of the polarized light pulses; and
    an optical transmitting port that directs altered light pulses from the vapor filled cell out of the sensor.

2. The sensor of claim 1,
    wherein the plurality of light pulses comprises pump pulses and probe pulses, and the polarizer comprises a linear polarizer and a circular polarizer; and
    wherein the pump pulses and probe pulses are directed from the depolarizer through the linear polarizer and the pump pulses are further directed from the linear polarizer through the circular polarizer.

3. The sensor of claim 2, further comprising at least two optical receiving ports, wherein one of the at least two optical receiving ports receives the pump pulses and another of the at least two optical receiving ports receives the probe pulses.

4. The sensor of claim 1,
    wherein the vapor-filled cell is thermally coupled to one or more exterior surfaces of the sensor; and
    wherein environmental heat outside the sensor is transferred to the vapor-filled cell and heats the vapor.

5. The sensor of claim 1, further comprising an optical heating port coupled to the vapor filled cell, wherein light received at the optical heating port is directed to the vapor filled cell and heats the vapor.

6. The sensor of claim 1, further comprising:
    an optical temperature port; and
    an optical temperature sensor coupled to the optical temperature port and to the vapor filled cell;
    wherein light directed to the optical temperature port from the optical temperature sensor reflects the temperature of the vapor.

7. The sensor of claim 1, wherein at least some of the inside surfaces of the vapor filled cell comprise a spin anti-relaxation coating.

8. An array of downhole all-optical magnetometer sensors, the array comprising:
    a plurality of sensors, each sensor comprising:
        one or more optical receiving ports that receive a plurality of polarized light pulses;
        a depolarizer, coupled to the one or more optical receiving ports, that depolarizes the plurality of received polarized light pulses;
        a polarizer coupled to the depolarizer that polarizes depolarized light pulses from the depolarizer;
        a vapor-filled cell through which polarized light pulses from the polarizer are directed, wherein interactions between vapor and a magnetic field within the vapor filled cell alter at least some of the polarized light pulses; and
        an optical transmitting port that directs altered light pulses from the vapor filled cell out of the sensor;
    at least one sensor of the plurality of sensors further comprising:
        an additional optical receiving port and one or more additional optical transmitting ports; and
        a plurality of optical waveguides that couple the additional optical receiving port and the one or more additional optical transmitting ports of the at least one sensor respectively to the optical transmitting port and the one or more receiving ports of another of the plurality of sensors.

9. The array of claim 8, the at least one sensor further comprising:
    one or more optical splitters that each distributes light pulses from the one or more optical receiving ports to the depolarizer and to at least one of the one or more additional optical transmitting ports; and
    an optical combiner that combines the altered light pulses from the vapor filled cell and additional altered light pulses from the additional optical receiving port and that directs combined altered light pulses to the optical transmitting port.

10. The array of claim 8, wherein for each sensor of the plurality of sensors:
    the plurality of light pulses comprises pump pulses and probe pulses, and the polarizer comprises a linear polarizer and a circular polarizer; and
    the pump pulses and probe pulses are directed from the depolarizer through the linear polarizer and the pump pulses are further directed from the linear polarizer through the circular polarizer.

11. The array of claim 10, the at least one sensor further comprising:
    at least two optical receiving ports, comprising the one or more optical receiving ports, wherein one of the at least two optical receiving ports receives the pump pulses and another of the at least two optical receiving ports receives the probe pulses;
    a first optical splitter that distributes pump pulses from the linear polarizer to the circular polarizer and to one of the one or more additional optical transmitting ports;

a second optical splitter that distributes probe pulses from the linear polarizer to the vapor-filled cell and to one of the one or more additional optical transmitting ports; and an optical combiner that combines the altered light pulses from the vapor filled cell and additional altered light pulses from the additional optical receiving port and that directs combined altered light pulses to the optical transmitting port.

12. The array of claim 10, the at least one sensor further comprising:

one or more optical splitters that distribute the pump pulses and probe pulses from the linear polarizer to the circular polarizer and to one of the one or more additional optical transmitting ports; and an optical combiner that combines the altered light pulses from the vapor filled cell and additional altered light pulses from the additional optical receiving port and that directs combined light pulses to the optical transmitting port.

13. The array of claim 12, the at least one sensor further comprising at least two optical receiving ports that comprise the one or more optical receiving ports, wherein one of the at least two optical receiving ports receives the pump pulses and another of the at least two optical receiving ports receives the probe pulses.

14. The array of claim 8, wherein for each of the plurality of sensors:

the vapor-filled cell is thermally coupled to one or more exterior surfaces of the sensor; and environmental heat around the sensor is transferred to the vapor-filled cell and heats the vapor.

15. The array of claim 8, each of the plurality of sensors further comprising an optical heating input port coupled to the vapor filled cell, wherein light received at the optical heating input port is directed to the vapor filled cell and heats the vapor.

16. The array of claim 15, the at least one sensor further comprising an optical heating output port coupled to the vapor-filled cell, and the array further comprising an optical waveguide that couples the optical heating output port to the optical heating input port of another of the plurality of sensors.

17. The array of claim 8, each of the plurality of sensors further comprising:

a first optical temperature port; and an optical temperature sensor coupled to the first optical temperature port and to the vapor filled cell;

wherein light directed to the first optical temperature port from the optical temperature sensor reflects the temperature of the vapor.

18. The array of claim 17, the at least one sensor further comprising a second optical temperature port coupled to the optical temperature sensor, and the array further comprising an optical waveguide that couples the second optical temperature port to the first optical temperature port of another of the plurality of sensors.

19. A downhole all-optical magnetometer system, comprising:

a downhole module comprising one or more downhole all-optical sensors, each sensor comprising:

one or more optical receiving ports that receive a plurality of polarized light pulses;

a depolarizer, coupled to the one or more optical receiving ports, that depolarizes the plurality of received polarized light pulses;

a polarizer coupled to the depolarizer that polarizes depolarized light pulses from the depolarizer;

a vapor-filled cell through which polarized light pulses from the polarizer are directed, wherein interactions between vapor and a magnetic field within the vapor filled cell alter at least some of the polarized light pulses; and an optical transmitting port that directs altered light pulses from the vapor filled cell out of the sensor;

a surface module, comprising:

one or more optical emitters; and an optical receiver; and at least two optical fibers, at least one of the at least two optical fibers coupling the one or more optical receiving ports to the one or more optical emitters, and another of the at least two optical fibers coupling the optical transmitting port to the optical receiver;

wherein at least some of the characteristics of one or more signals from the optical receiver are representative of characteristics of the magnetic field within the vapor filled cell of each sensor.

20. The system of claim 19, further comprising a computer system, coupled to the electronics module, that processes data representative of the received signal characteristics and that further presents to a user information derived from processed data representative of the magnetic field within the vapor-filled cell of each sensor.

21. The system of claim 19, wherein the downhole module comprises two or more downhole all-optical sensors that are each optically coupled to at least one other of the two or more downhole all-optical sensors.

22. The system of claim 19, further comprising:

two additional optical fibers coupling at least one of the one or more downhole all optical sensors to the surface module;

each sensor further comprising:

a first optical temperature port;

an optical temperature sensor coupled to the first optical temperature port and to the vapor filled cell; and an optical heating port coupled to the vapor filled cell that directs light to the vapor filled cell that heats the vapor; and a computer system coupled to the surface module;

the surface module further comprising:

an optical transceiver, coupled by one of the two additional optical fibers to the first optical temperature port, that transmits to the computer system signals representative of the vapor's temperature; and an additional optical emitter, coupled by another of the two additional optical fibers to the optical heating port, that receives from the computer system signals that control light generated by the additional emitter;

wherein the computer system controls the heating of the vapor by controlling the characteristics of the light generated by the additional emitter based on the vapor's temperature.

23. The system of claim 19, wherein for each sensor:

the vapor-filled cell is thermally coupled to one or more exterior surfaces of the sensor; and environmental heat around the sensor is transferred to the vapor-filled cell and heats the vapor.

24. The system of claim 19, further comprising a computer system coupled to the surface module;

an additional optical fiber; and the surface module further comprising:

an additional optical emitter; and an additional optical receiver;

wherein the additional optical fiber is coupled to the additional optical emitter, is routed from the surface module downhole to the downhole module, loops back uphole and is routed back to the surface module, and is coupled to the additional optical receiver; and wherein the computer system subtracts a reference signal produced by the additional optical receiver from the one or more signals from the optical receiver to isolate the at least some of the characteristics of the one or more signals representative of characteristics of the magnetic field and further presents magnetic field characteristics data to a user.

25. A method for operating a downhole all-optical magnetometer system, comprising:

directing polarized light pulses generated by at least one optical emitter located at the surface of a well through a first optical fiber to one or more downhole sensors;

for each of the one or more downhole sensors:
depolarizing the polarized light pulses received at the one or more downhole sensors;
polarizing depolarized light pulses produced by the depolarizing; and
directing polarized light pulses produced by the polarizing through a vapor filled cell;

directing light pulses exiting the vapor filled cell of the at least one of the one or more downhole sensors through a second optical fiber to an optical receiver located at the surface of the well;

identifying differences between emitter-generated light pulses and light pulses received by the optical receiver; and presenting to a user data describing a magnetic field detected by the one or more downhole sensors based at least in part on the identified differences.

26. The method of claim 25, further comprising:

receiving, by an additional optical receiver at the surface of the well, light from at least one of the one or more downhole sensors through a third optical fiber, said light being representative of the temperature of a vapor within the vapor filled cell;

directing additional light pulses generated by an additional optical emitter located at the surface of the well through a fourth optical fiber to at least one of the one or more downhole sensors; and controlling the heating of the vapor based on the vapor's temperature by controlling the characteristics of the additional light pulses.

27. The method of claim 26, further comprising coupling ambient downhole heat to the vapor filled cell, further heating the vapor filled cell.

28. The method of claim 25, wherein the light pulses comprise pump pulses and probe pulses, and wherein polarizing the light pulses comprises linearly polarizing the pump pulses and the probe pulses and circularly polarizing the pump pulses.

29. The method of claim 28, further comprising, for at least one of two or more downhole sensors:

splitting light pulses resulting from the linear polarizing;
directing pump pulses of a first portion of the split light pulses to the circular polarizing;
directing probe pulses of the first portion of the split light pulses to the circular polarizing or through the vapor-filled cell;
directing a second portion of the split light pulses to another of the two or more sensors; and
combining the light pulses exiting the vapor filled cell and light pulses exiting the another of the two or more sensors.

30. The method of claim 25, further comprising, for at least one of two or more downhole sensors:

splitting the light pulses received by the at least one of the two or more downhole sensors;
directing a first portion of the split light pulses to the polarizing;
directing a second portion of the split light pulses to another of the two or more sensors; and
combining the light pulses exiting the vapor filled cell and light pulses exiting the another of the two or more sensors.

* * * * *

UNITED STATES PATENT AND TRADEMARK OFFICE
CERTIFICATE OF CORRECTION

| | | |
|---|---|---|
| PATENT NO. | : 9,983,276 B2 | Page 1 of 1 |
| APPLICATION NO. | : 13/532538 | |
| DATED | : May 29, 2018 | |
| INVENTOR(S) | : Christopher L. Stokely | |

It is certified that error appears in the above-identified patent and that said Letters Patent is hereby corrected as shown below:

In the Specification

In Column 6, Line 38, after --electrons-- delete "process" and insert --precess--

In Column 7, Line 26, after --magnetization-- delete "processes" and insert --precesses--

Signed and Sealed this
Twenty-eighth Day of August, 2018

Andrei Iancu
*Director of the United States Patent and Trademark Office*